US012577660B2

(12) United States Patent
Mitsui et al.

(10) Patent No.: US 12,577,660 B2
(45) Date of Patent: Mar. 17, 2026

(54) COMPOUND, THIN-FILM FORMING RAW MATERIAL, THIN-FILM, AND METHOD OF PRODUCING THIN-FILM

(71) Applicant: ADEKA CORPORATION, Tokyo (JP)

(72) Inventors: Chiaki Mitsui, Tokyo (JP); Masako Hatase, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 4 days.

(21) Appl. No.: 18/575,951

(22) PCT Filed: Jun. 27, 2022

(86) PCT No.: PCT/JP2022/025490

§ 371 (c)(1),
(2) Date: Jan. 2, 2024

(87) PCT Pub. No.: WO2023/282104

PCT Pub. Date: Jan. 12, 2023

(65) Prior Publication Data

US 2024/0318304 A1 Sep. 26, 2024

(30) Foreign Application Priority Data

Jul. 7, 2021 (JP) ................................. 2021-112540

(51) Int. Cl.
*C23C 16/18* (2006.01)
*C07F 7/00* (2006.01)

(52) U.S. Cl.
CPC .................................... *C23C 16/18* (2013.01)

(58) Field of Classification Search
None
See application file for complete search history.

(56) References Cited

U.S. PATENT DOCUMENTS

| | | | | |
|---|---|---|---|---|
| 8,937,195 B2 * | 1/2015 | Senda | .................... | B01J 31/143 585/512 |
| 9,156,970 B2 * | 10/2015 | Hlavinka | .............. | C08F 210/02 |

(Continued)

FOREIGN PATENT DOCUMENTS

| | | | |
|---|---|---|---|
| CN | 111683953 A | 9/2020 |
| JP | 8-253522 A | 10/1996 |

(Continued)

OTHER PUBLICATIONS

Rhodes et al., "Olefin Polymerization by Cyclopentadienyltris(dimethylamido)titanium(IV) Complexes," J. Polym. Sci. Part A: Poly. Chem., vol. 39, 313-319 (2001). (Year: 2001).*

(Continued)

*Primary Examiner* — Catherine S Branch
(74) *Attorney, Agent, or Firm* — Greenblum & Bernstein, P.L.C.

(57) ABSTRACT

A compound is represented by the following general formula (1), a thin-film forming raw material including the compound, a thin-film, and a method of producing a thin-film:

(1)

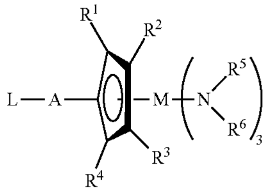

wherein $R^1$ to $R^4$ each independently represent a hydrogen atom or an alkyl group having 1 to 5 carbon atoms, $R^5$ and $R^6$ each independently represent an alkyl group having 1 to 5 carbon atoms, A represents an alkanediyl group having 1 to 5 carbon atoms, L represents a group represented by the general formula (L-1) or (L-2) described herein, and M represents a hafnium atom, a zirconium atom, or a titanium atom, provided that in a case of a compound in which $R^5$ and $R^6$ each represent a methyl group, A represents an alkanediyl group (Continued)

having 2 carbon atoms, and M represents a titanium atom, L represents a group represented by the general formula (L-2).

5 Claims, 4 Drawing Sheets

(56) References Cited

U.S. PATENT DOCUMENTS

| | | | | |
|---|---|---|---|---|
| 2013/0337659 | A1 | 12/2013 | Ahn et al. | |
| 2016/0076144 | A1* | 3/2016 | Varanasi | C23C 16/40 427/255.391 |
| 2017/0291973 | A1* | 10/2017 | Munro | C07F 17/00 |
| 2018/0134821 | A1* | 5/2018 | Pannell | C08F 10/02 |
| 2020/0361969 | A1 | 11/2020 | Han et al. | |

FOREIGN PATENT DOCUMENTS

| | | | |
|---|---|---|---|
| JP | 2002-93803 | A | 3/2002 |
| JP | 2002-93804 | A | 3/2002 |
| JP | 2012-69871 | A | 4/2012 |
| JP | 2014-39045 | A | 2/2014 |
| JP | 2014-510733 | A | 5/2014 |
| JP | 2021-512901 | A | 5/2021 |
| WO | 2007/066546 | A1 | 6/2007 |
| WO | 2012/124913 | A2 | 9/2012 |
| WO | 2021/211485 | A1 | 10/2021 |

OTHER PUBLICATIONS

Jutzi et al., "Half-sandwich complexes of titanium and zirconium with the (diisopropylaminoethyl) cyclpentadienyl ligand: molecular structure of [(C5H4CH2CH2N(H)iPr2)ZrC13]+C1-2CH30H", Journal of Organometallic Chemistry, vol. 533, 1997, pp. 237-245.

Jutzi et al., "Titanuium and zirconium complexes containing the (N, N-dimethylaminoethyl) cyclopentadienyl ligand", Journal of Organometallic Chemistry, vol. 486, 1995, pp. 287-289.

International Search Report dated Aug. 8, 2022 in International Bureau of WIPO Patent Application No. PCT/JP2022/025490 with an English translation thereof.

Written Opinion dated Aug. 8, 2022 in International Bureau of WIPO Patent Application No. PCT/JP2022/025490 with an English translation thereof.

Office Action that issued on Jan. 20, 2026, in corresponding Japanese Application No. 2023-533540, along with English translation thereof.

* cited by examiner

[Fig. 1]
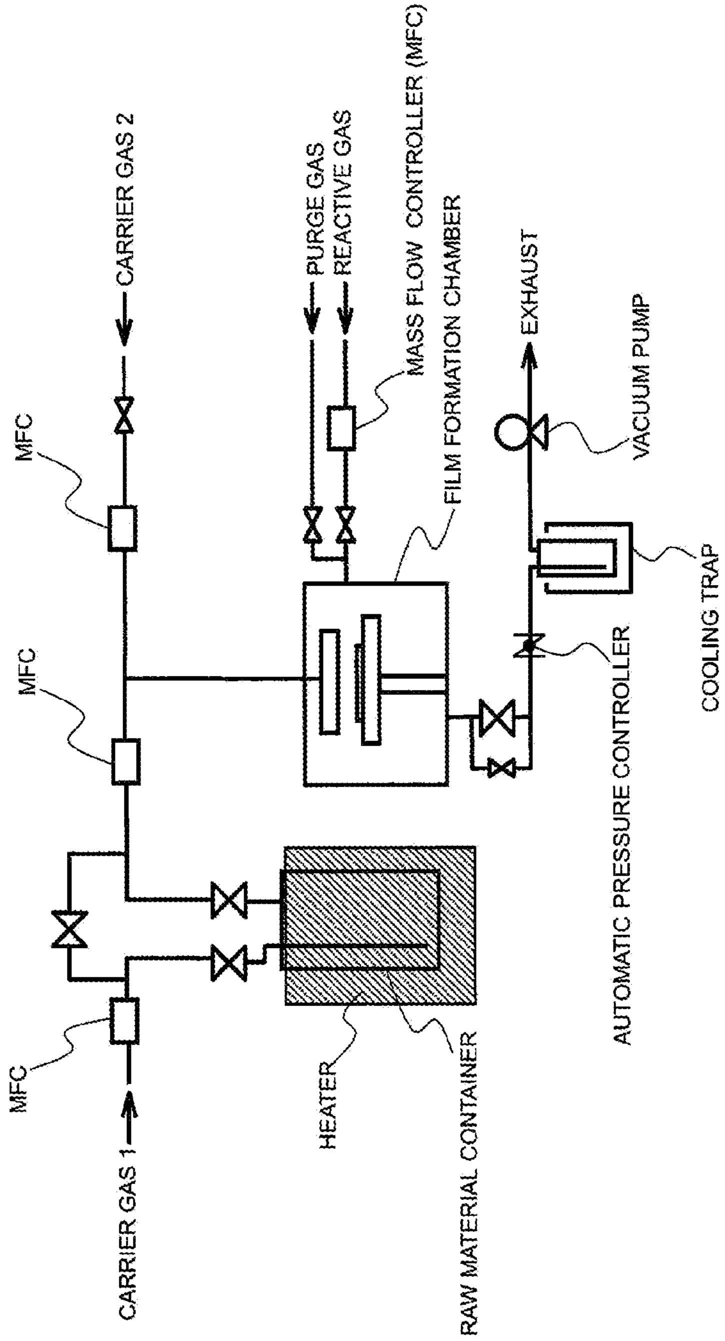

[Fig. 2]
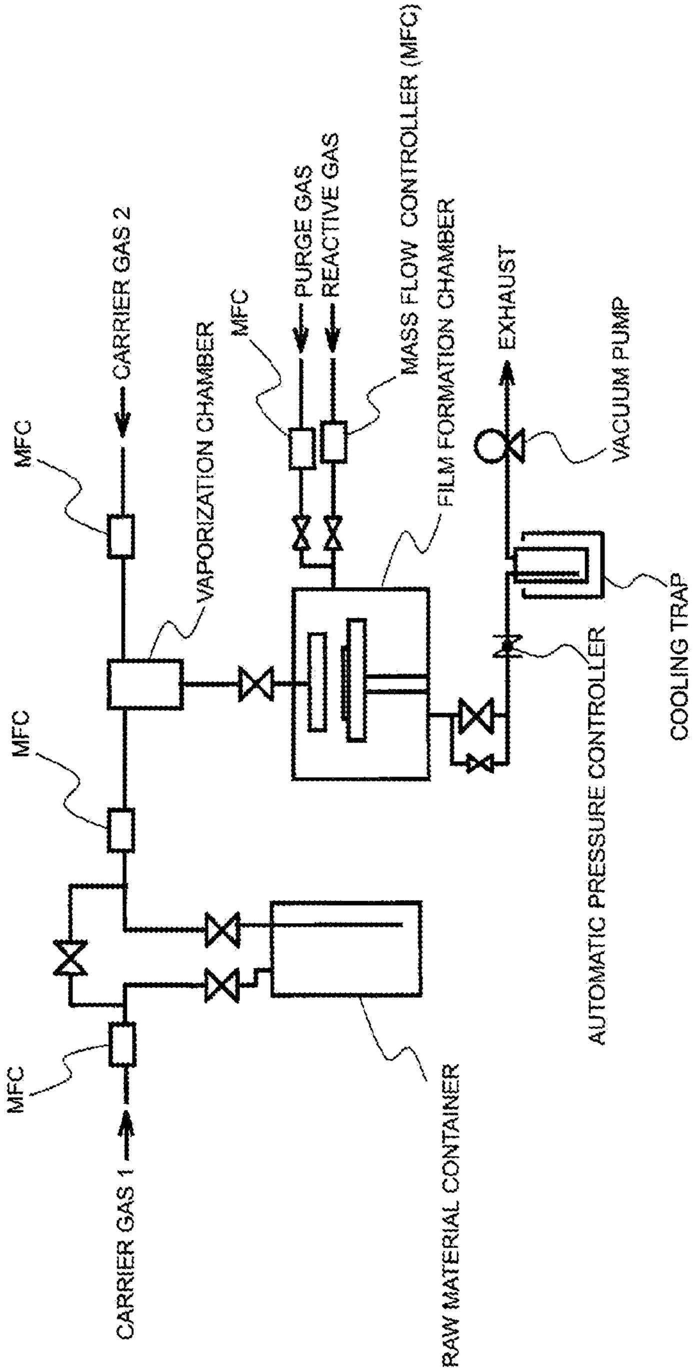

[Fig. 3]
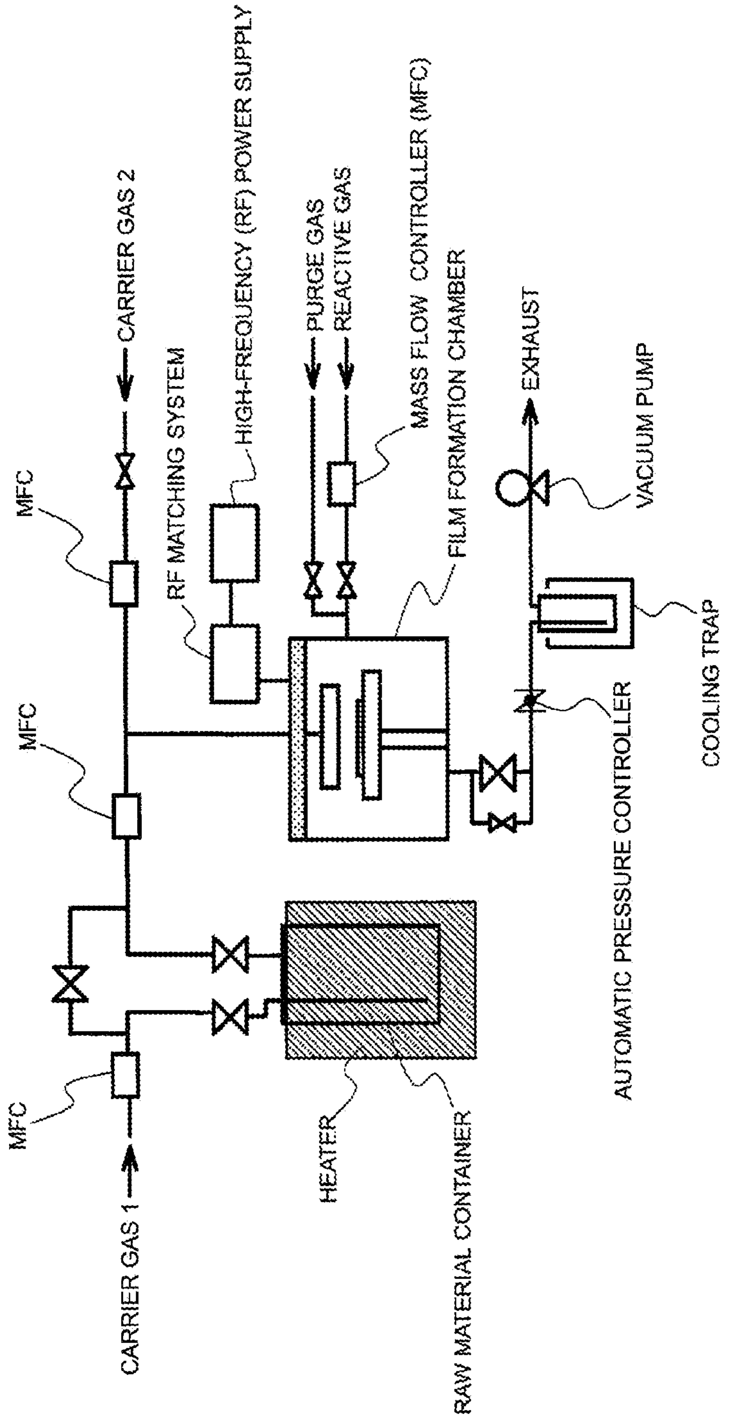

[Fig. 4]
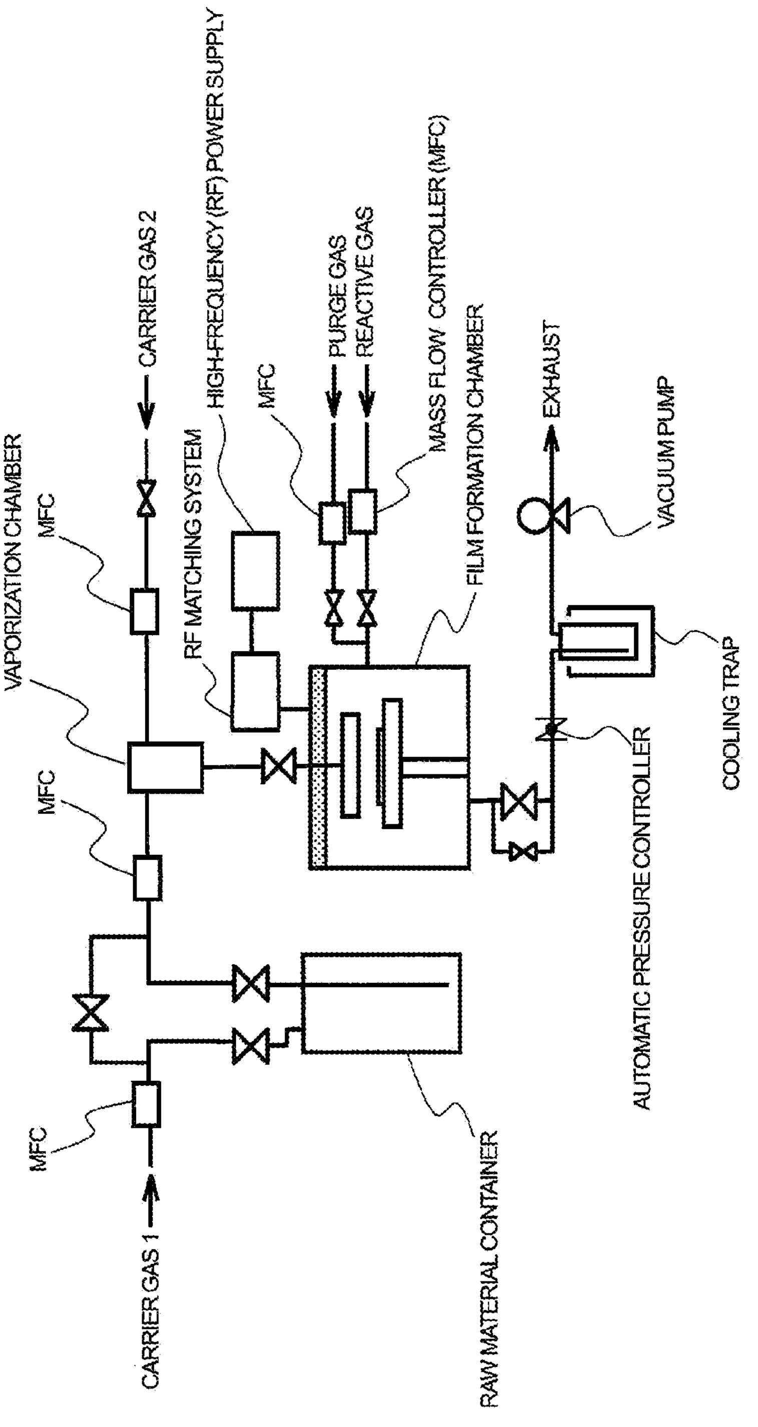

COMPOUND, THIN-FILM FORMING RAW MATERIAL, THIN-FILM, AND METHOD OF PRODUCING THIN-FILM

TECHNICAL FIELD

The present invention relates to a compound having a specific structure, a thin-film forming raw material containing the compound, a thin-film, and a method of producing a thin-film including using the thin-film forming raw material.

BACKGROUND ART

A thin-film forming material containing a hafnium atom, a zirconium atom, or a titanium atom has been used as a high-dielectric constant material for producing, for example, the capacitor film of a DRAM and the gate insulating film of a logic circuit.

As a method of producing the above-mentioned thin-film, there are given, for example, a sputtering method, an ion plating method, MOD methods, such as a coating thermal decomposition method and a sol-gel method, and a chemical vapor deposition method. Of those, a chemical vapor deposition (hereinafter sometimes simply referred to as "CVD") method including an atomic layer deposition (hereinafter sometimes simply referred to as "ALD") method is an optimum production method because the method has many advantages, such as excellent composition controllability and step coverage, suitability for mass production, and capability of hybrid integration.

Various raw materials have been frequently reported as Group IV element supply sources to be used in the chemical vapor deposition method. For example, Patent Document 1 discloses a tetrakis(dialkylamido)zirconium, and Patent Document 2 discloses a tetrakis(dialkylamido)hafnium. In addition, Patent Document 3 discloses a Group IV element-containing compound having a cyclopentadienyl structure and an amino group.

CITATION LIST

Patent Document

[Patent Document 1] JP 2002-93803 A
[Patent Document 2] JP 2002-93804 A
[Patent Document 3] JP 2014-510733 A

SUMMARY OF INVENTION

Technical Problem

In a method including vaporizing a compound to form a thin-film such as the CVD method, an important property that a compound (precursor) to be used as a thin-film forming raw material is required to have is as follows: a high-quality thin-film reduced in amount of impurities such as residual carbon derived from a raw material can be produced. However, the related-art Group IV element-containing compound has not been sufficiently satisfactory in terms of this property.

Accordingly, an object of the present invention is to provide a Group IV element-containing compound, which can produce a high-quality thin-film reduced in amount of impurities such as residual carbon derived from a raw material when used as a thin-film forming raw material.

Solution to Problem

The inventors of the present invention have made investigations, and as a result, have found that a Group IV element-containing compound having a specific structure can solve the above-mentioned problems. Thus, the inventors have reached the present invention.

That is, according to one embodiment of the present invention, there is provided a compound represented by the following general formula (1):

(1)

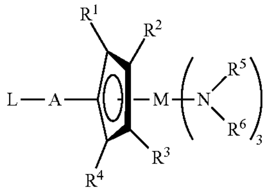

where $R^1$ to $R^4$ each independently represent a hydrogen atom or an alkyl group having 1 to 5 carbon atoms, $R^5$ and $R^6$ each independently represent an alkyl group having 1 to 5 carbon atoms, A represents an alkanediyl group having 1 to 5 carbon atoms, L represents a group represented by the following general formula (L-1) or (L-2), and M represents a hafnium atom, a zirconium atom, or a titanium atom, provided that in a case of a compound in which $R^5$ and $R^6$ each represent a methyl group, A represents an alkanediyl group having 2 carbon atoms, and M represents a titanium atom, L represents a group represented by the following general formula (L-2):

(L-1)

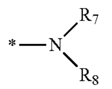

(L-2)

$*-O-R^9$ where $R^7$ to $R^9$ each independently represent an alkyl group having 1 to 5 carbon atoms, and * represents a bonding site, provided that in a case of a compound represented by the general formula (1) in which $R^5$ and $R^6$ each represent a methyl group, A represents an alkanediyl group having 2 carbon atoms, and M represents a zirconium atom, $R^7$ represents a methyl group or an ethyl group.

According to one embodiment of the present invention, there is provided a thin-film forming raw material, including the compound.

According to one embodiment of the present invention, there is provided a thin-film, which is produced by using the thin-film forming raw material.

According to one embodiment of the present invention, there is provided a method of producing a thin-film, including forming, on a surface of a substrate, a thin-film containing at least one kind of metal atom selected from the group consisting of: a hafnium atom; a zirconium atom; and a titanium atom through use of the thin-film forming raw material.

Advantageous Effects of Invention

According to the present invention, the compound, which can produce a high-quality thin-film reduced in amount of impurities such as residual carbon derived from a raw material when used as a thin-film forming raw material, can be provided.

BRIEF DESCRIPTION OF DRAWINGS

FIG. 1 is a schematic diagram for illustrating an example of an ALD apparatus to be used in a method of producing a thin-film according to the present invention.

FIG. 2 is a schematic diagram for illustrating another example of the ALD apparatus to be used in the method of producing a thin-film according to the present invention.

FIG. 3 is a schematic diagram for illustrating still another example of the ALD apparatus to be used in the method of producing a thin-film according to the present invention.

FIG. 4 is a schematic diagram for illustrating still another example of the ALD apparatus to be used in the method of producing a thin-film according to the present invention.

DESCRIPTION OF EMBODIMENTS

<Compound>

A compound of the present invention is represented by the general formula (1). The compound represented by the general formula (1) (hereinafter sometimes referred to as "compound of the present invention") is suitable as a precursor in a method of producing a thin-film including a vaporization step such as an ALD method, which is one kind of CVD method.

In the general formula (1), $R^1$ to $R^4$ each independently represent a hydrogen atom or an alkyl group having 1 to 5 carbon atoms, $R^5$ and $R^6$ each independently represent an alkyl group having 1 to 5 carbon atoms, A represents an alkanediyl group having 1 to 5 carbon atoms, L represents a group represented by the general formula (L-1) or (L-2), and M represents a hafnium atom, a zirconium atom, or a titanium atom, provided that in a case of a compound in which $R^5$ and $R^6$ each represent a methyl group, A represents an alkanediyl group having 2 carbon atoms, and M represents a titanium atom, L represents a group represented by the general formula (L-2).

In addition, in the general formulae (L-1) and (L-2), $R^7$ to $R^9$ each independently represent an alkyl group having 1 to 5 carbon atoms, and * represents a bonding site, provided that in a case of a compound represented by the general formula (1) in which $R^5$ and $R^6$ each represent a methyl group, A represents an alkanediyl group having 2 carbon atoms, and M represents a zirconium atom, $R^7$ represents a methyl group or an ethyl group.

Examples of the "alkyl group having 1 to 5 carbon atoms" include a methyl group, an ethyl group, a propyl group, an isopropyl group, a butyl group, an isobutyl group, a sec-butyl group, a tert-butyl group, a pentyl group, an isopentyl group, and a neopentyl group.

Examples of the "alkanediyl group having 1 to 5 carbon atoms" include a methylene group, an ethylene group, a propane-1,3-diyl group, a propane-1,2-diyl group, a butane-1,4-diyl group, a butane-1,3-diyl group, a butane-2,3-diyl group, a butane-1,2-diyl group, a pentane-1,1-diyl group, a pentane-1,2-diyl group, a pentane-1,3-diyl group, a pentane-1,4-diyl group, and a pentane-1,5-diyl group.

In the general formula (1), $R^1$ to $R^6$, A, L, and M are appropriately selected in accordance with a method of producing a thin-film to be applied. When the compound of the present invention is used in a method of producing a thin-film including a step of vaporizing a compound, such as a CVD method or an ALD method, $R^1$ to $R^6$, A, L, and M are preferably selected so that the compound may have a high vapor pressure, a low melting point, and high thermal stability.

$R^1$ to $R^4$ in the general formula (1) each independently represent preferably a hydrogen atom or an alkyl group having 1 to 3 carbon atoms, more preferably a hydrogen atom because the compound has a high vapor pressure and high thermal stability, and can produce a high-quality thin-film with high productivity when used as a thin-film forming raw material. In particular, all of $R^1$ to $R^4$ even more preferably represent hydrogen atoms.

In addition, $R^5$ and $R^6$ each independently represent preferably an alkyl group having 1 to 3 carbon atoms, more preferably a methyl group or an ethyl group, even more preferably a methyl group, and both of $R^5$ and $R^6$ most preferably represent methyl groups because the compound has a high vapor pressure, and can produce a high-quality thin-film with high productivity when used as a thin-film forming raw material.

Further, A represents preferably an alkanediyl group having 2 or 3 carbon atoms, more preferably an ethylene group or a propane-1,3-diyl group because the compound has high thermal stability and a low melting point, and can produce a high-quality thin-film with high productivity when used as a thin-film forming raw material. In particular, when L represents a group represented by the general formula (L-1), A more preferably represents an ethylene group, and when L represents a group represented by the general formula (L-2), A more preferably represents a propane-1,3-diyl group.

In addition, M represents preferably a hafnium atom or a zirconium atom, more preferably a hafnium atom because the compound can produce a high-quality thin-film with high productivity when used as a thin-film forming raw material.

In addition, in the general formulae (L-1) and (L-2), $R^7$ to $R^9$ are appropriately selected in accordance with a method of producing a thin-film to be applied. When the compound of the present invention is used in a method of producing a thin-film including a step of vaporizing a compound, such as a CVD method or an ALD method, $R^7$ to $R^9$ are preferably selected so that the compound may have a high vapor pressure, a low melting point, and high thermal stability.

$R^7$ to $R^9$ each independently represent preferably an alkyl group having 1 to 3 carbon atoms, more preferably a methyl group or an ethyl group, even more preferably a methyl group because the compound has a high vapor pressure and high thermal stability, and can produce a high-quality thin-film with high productivity when used as a thin-film forming raw material. In particular, in the general formula (L-1), both of $R^7$ and $R^8$ most preferably represent methyl groups.

In addition, when the compound of the present invention is used in a method of producing a thin-film by a MOD method free of any vaporization step, $R^1$ to $R^9$, A, L, and M in the general formulae (1), (L-1), and (L-2) may be arbitrarily selected in accordance with, for example, the solubility of the compound in a solvent to be used and a thin-film formation reaction.

Preferred specific examples of the compound represented by the general formula (1) include Compounds No. 1 to No. 121 below. In Compounds No. 1 to No. 121 below, "Me" represents a methyl group, "Et" represents an ethyl group, "nPr" represents a n-propyl group, and "iPr" represents an isopropyl group.

No. 1
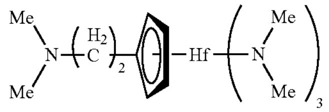
No. 2
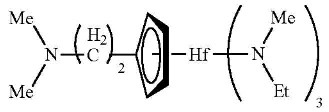
No. 3
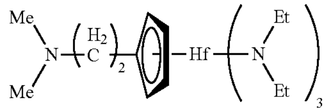
No. 4
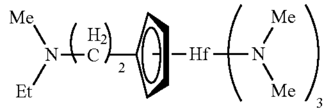
No. 5
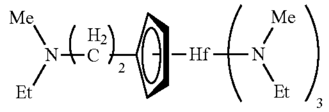
No. 6
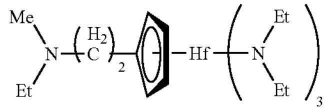
No. 7
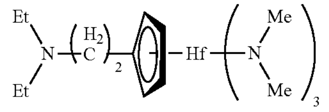
No. 8
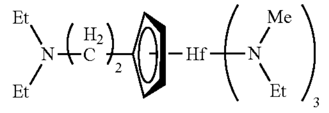
No. 9
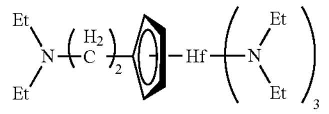
No. 10
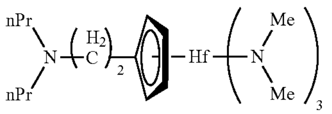
No. 11
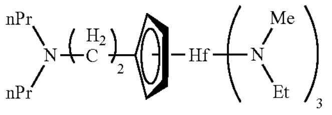
No. 12
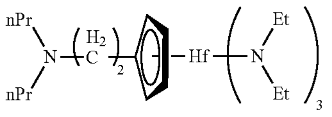
-continued
No. 13
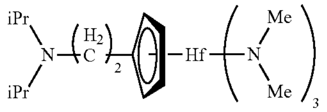
No. 14
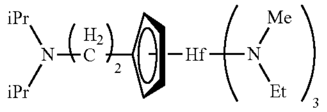
No. 15
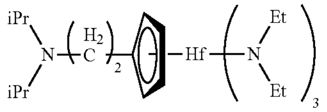
No. 16
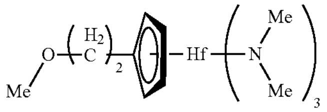
No. 17
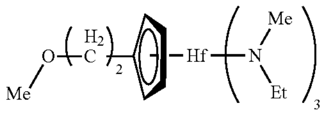
No. 18
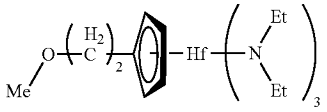
No. 19
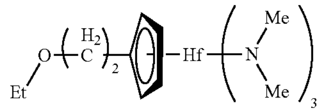
No. 20
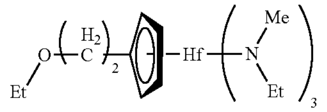
No. 21
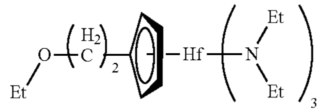
No. 22
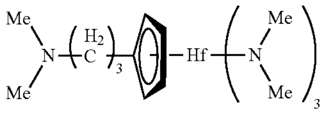
No. 23
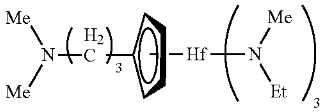
No. 24
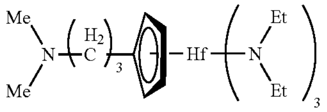

-continued
No. 25
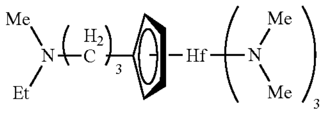
No. 26
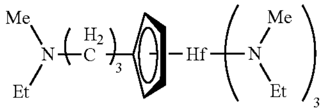
No. 27
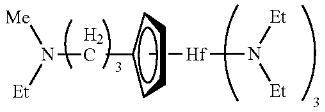
No. 28
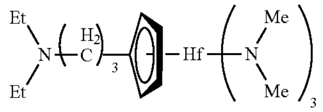
No. 29
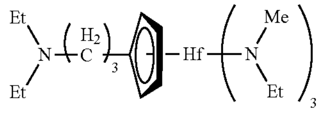
No. 30
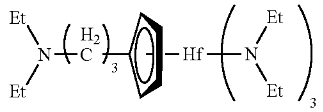
No. 31
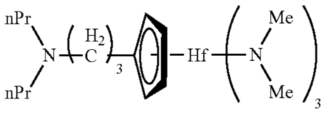
No. 32
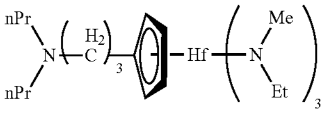
No. 33
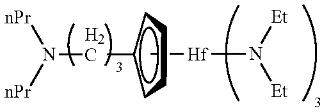
No. 34
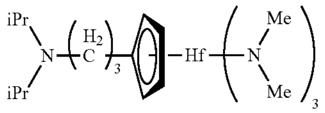
No. 35
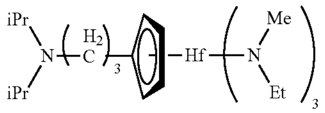
No. 36
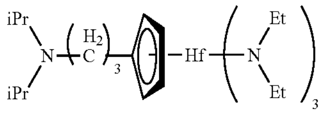
-continued
No. 37
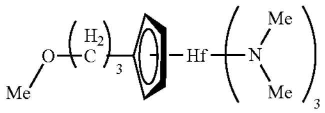
No. 38
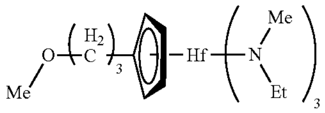
No. 39
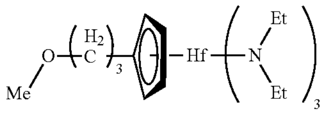
No. 40
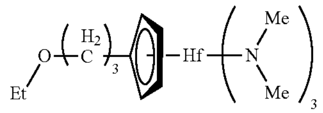
No. 41
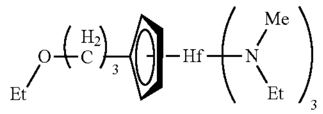
No. 42
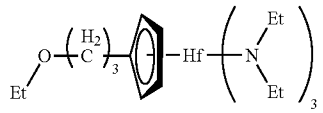
No. 43
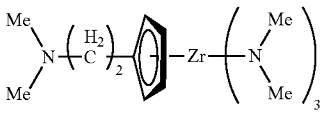
No. 44
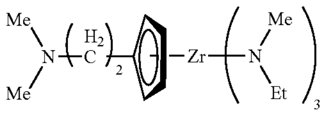
No. 45
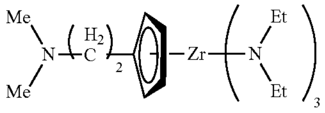
No. 46
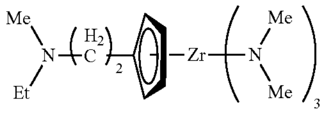
No. 47
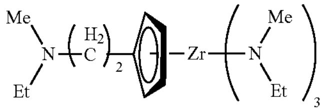
No. 48
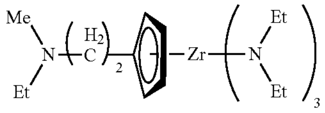

-continued
No. 49
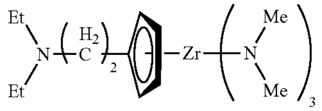
No. 50
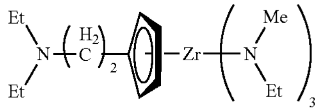
No. 51
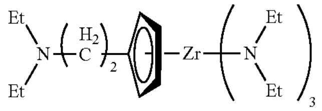
No. 52
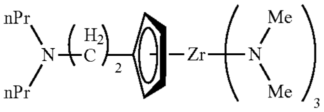
No. 53
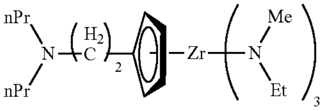
No. 54
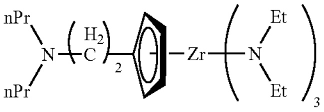
No. 55
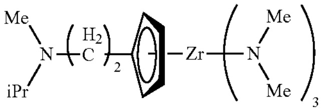
No. 56
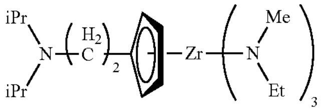
No. 57
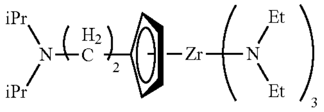
No. 58
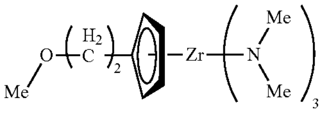
No. 59
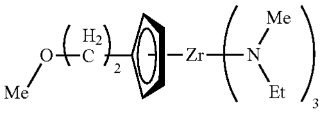
No. 60
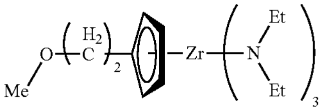
-continued
No. 61
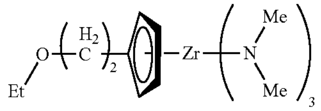
No. 62
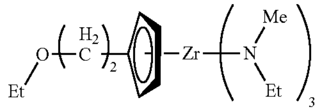
No. 63
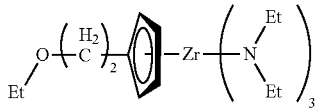
No. 64
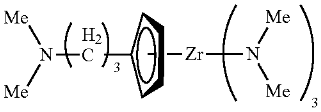
No. 65
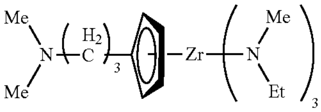
No. 66
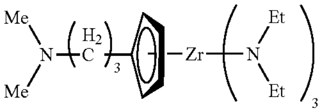
No. 67
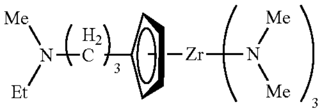
No. 68
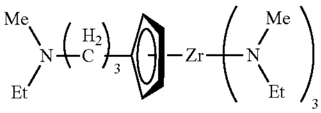
No. 69
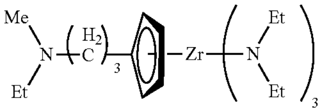
No. 70
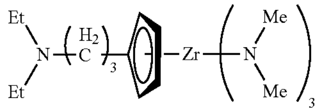
No. 71
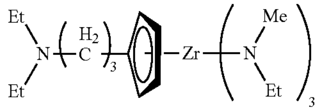
No. 72
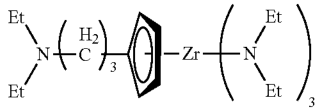

-continued
No. 73
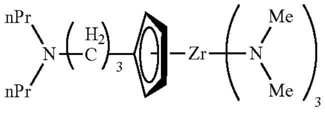
No. 74
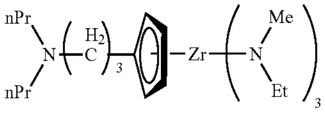
No. 75
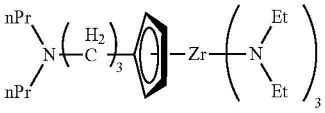
No. 76
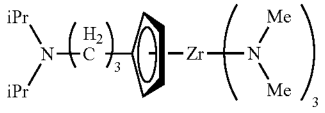
No. 77
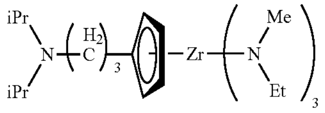
No. 78
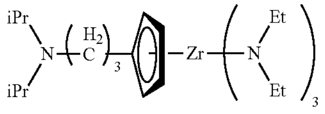
No. 79
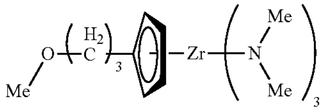
No. 80
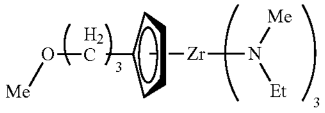
No. 81
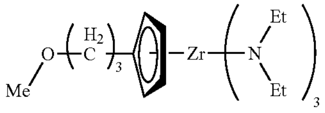
No. 82
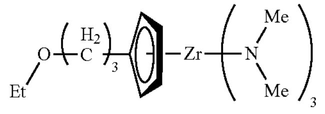
No. 83
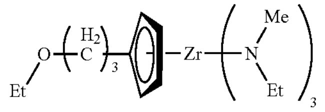
No. 84
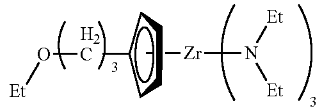
-continued
No. 85
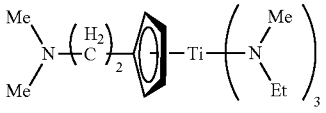
No. 86
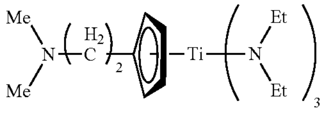
No. 87
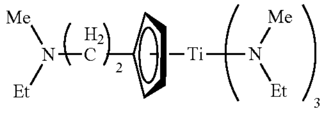
No. 88
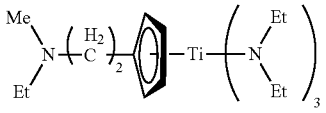
No. 89
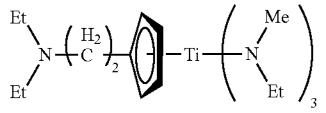
No. 90
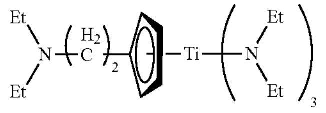
No. 91
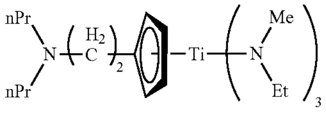
No. 92
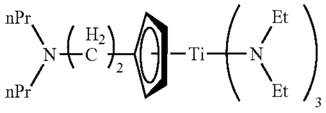
No. 93
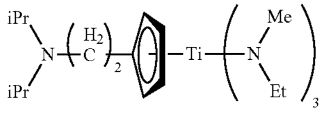
No. 94
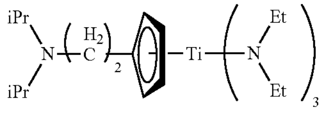
No. 95
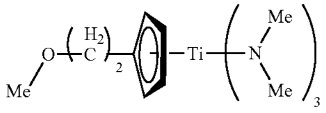
No. 96
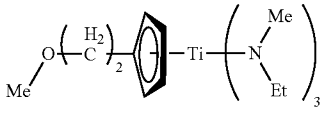

-continued
No. 97
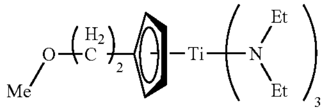
No. 98
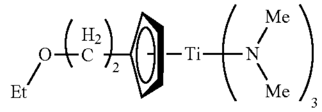
No. 99
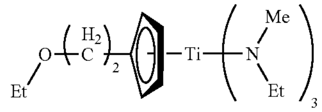
No. 100
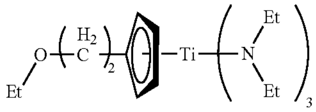
No. 101
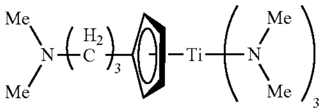
No. 102
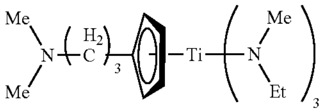
No. 103
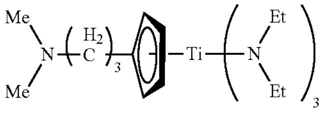
No. 104
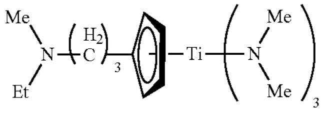
No. 105
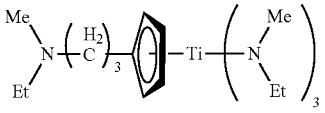
No. 106
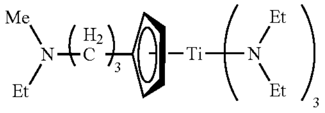
No. 107
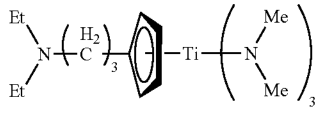
No. 108
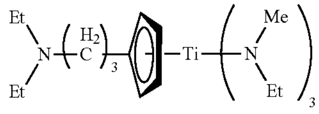
-continued
No. 109
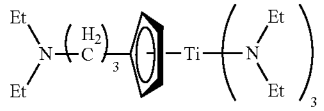
No. 110
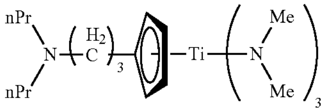
No. 111
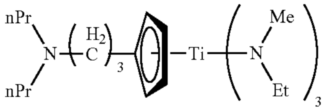
No. 112
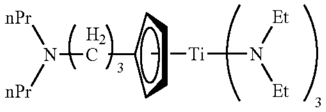
No. 113
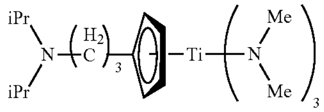
No. 114
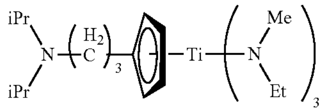
No. 115
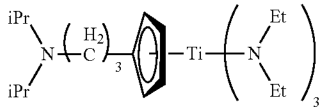
No. 116
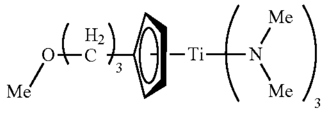
No. 117
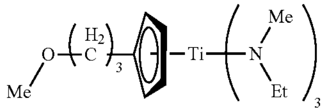
No. 118
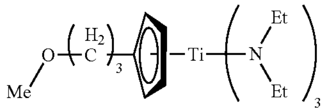
No. 119
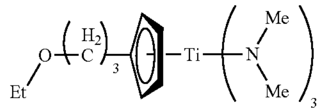
No. 120
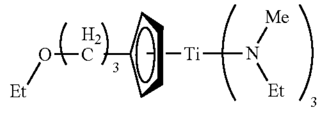

-continued

No. 121

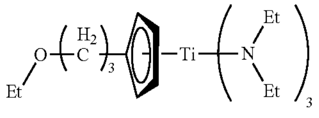

Of the above-mentioned compounds, compounds having structures represented by No. 1, No. 16, No. 22, No. 37, and No. 58 are preferred. The compounds having structures represented by No. 1, No. 22, and No. 37 are more preferred because the compounds are each particularly excellent in thermal stability. The compounds having structures represented by No. 1 and No. 22 are even more preferred because each of the compounds can produce a thin-film with high productivity. The compound having a structure represented by No. 1 is most preferred because the compound can produce a thin-film with particularly high productivity.

A method of producing the compound represented by the general formula (1) is not particularly limited, and the compound is produced by applying a well-known reaction. The compound represented by the general formula (1) may be obtained by, for example, causing a tetrakis(dialkylamino)hafnium, a tetrakis(dialkylamino)zirconium, or a tetrakis (dialkylamino) titanium and a cyclopentadiene compound having a corresponding structure to react with each other under a dehydrated toluene solvent, and then subjecting the reaction product to desolvation and distillation purification.

<Thin-Film Forming Raw Material>

Next, a thin-film forming raw material of the present invention is described. The thin-film forming raw material of the present invention contains the compound represented by the general formula (1) as a precursor of a thin-film. Its form varies depending on a production method to which the thin-film forming raw material is applied. For example, when a thin-film containing only at least one kind of metal atom selected from the group consisting of: a hafnium atom; a zirconium atom; and a titanium atom is produced, the thin-film forming raw material of the present invention is free of a metal compound except the compound represented by the general formula (1) and a semimetal compound. Meanwhile, when a thin-film containing a metal except a hafnium atom, a zirconium atom, or a titanium atom and/or a semimetal is produced, the thin-film forming raw material of the present invention may contain a compound containing a desired metal and/or a compound containing the semimetal (hereinafter sometimes referred to as "other precursor") in addition to the compound represented by the general formula (1). The thin-film forming raw material of the present invention may further contain an organic solvent and/or a nucleophilic reagent as described later. As described above, the physical properties of the compound represented by the general formula (1) serving as the precursor are suitable for a CVD method, and hence the thin-film forming raw material of the present invention is useful as a chemical vapor deposition raw material (hereinafter sometimes referred to as "CVD raw material"). Of those, the compound represented by the general formula (1) has a wide ALD window, and hence the thin-film forming raw material of the present invention is particularly suitable for an ALD method, and is preferably used as an ALD thin-film forming raw material.

When the thin-film forming raw material of the present invention is a chemical vapor deposition raw material, its form is appropriately selected in accordance with a procedure such as a transport and supply method of the CVD method to be used.

As the above-mentioned transport and supply method, there are given a gas transport method and a liquid transport method. The gas transport method involves vaporizing the CVD raw material by being heated and/or depressurized in a container in which the CVD raw material is stored (hereinafter sometimes referred to as "raw material container") to provide a raw material gas, and introducing the raw material gas into a film formation chamber having a substrate set therein together with a carrier gas, such as argon, nitrogen, or helium, to be used as required. The liquid transport method involves transporting the CVD raw material to a vaporization chamber under the state of a liquid or a solution, vaporizing the CVD raw material by being heated and/or depressurized in the vaporization chamber to provide a raw material gas, and introducing the raw material gas into the film formation chamber. In the case of the gas transport method, the very compound represented by the general formula (1) may be used as the CVD raw material. In the case of the liquid transport method, the very compound represented by the general formula (1) or a solution obtained by dissolving the compound in an organic solvent may be used as the CVD raw material. Any such CVD raw material may further contain the other precursor, a nucleophilic reagent, and the like.

In addition, in a multi-component CVD method, there are given a method involving vaporizing and supplying the CVD raw material independently for each component (hereinafter sometimes referred to as "single source method"), and a method involving vaporizing and supplying a mixed raw material obtained by mixing a multi-component raw material with desired composition in advance (hereinafter sometimes referred to as "cocktail source method"). In the case of the cocktail source method, a mixture of the compound represented by the general formula (1) and the other precursor or a mixed solution obtained by dissolving the mixture in an organic solvent may be used as the CVD raw material. The mixture and the mixed solution may each further contain a nucleophilic reagent and the like.

There is no particular limitation on the above-mentioned organic solvent, and a well-known and general organic solvent may be used. Examples of the organic solvent include: acetic acid esters, such as ethyl acetate, butyl acetate, and methoxyethyl acetate; ethers, as tetrahydrofuran, such tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,4-dicyanocyclohexane, and 1,4-dicyanobenzene; and pyridine and lutidine. Those organic solvents may be used alone or as a mixture thereof in accordance with the solubility of a solute, a relationship among the use temperature, boiling point, and flash point of each of the solvents, and the like.

When the thin-film forming raw material of the present invention is a mixed solution with the above-mentioned organic solvent, the amount of the entire precursors in the thin-film forming raw material is preferably from 0.01 mol/liter to 2.0 mol/liter, more preferably from 0.05 mol/liter to 1.0 mol/liter because a thin-film can be produced with high productivity.

When the thin-film forming raw material of the present invention is free of a metal compound except the compound represented by the general formula (1) and a semimetal compound, the term "amount of the entire precursors" as used herein means the amount of the compound represented by the general formula (1). When the thin-film forming raw material of the present invention contains a compound containing any other metal and/or a compound containing a semimetal (other precursor) in addition to the compound represented by the general formula (1), the term means the total amount of the compound represented by the general formula (1) and the other precursor.

In addition, in the case of the multi-component CVD method, there is no particular limitation on the other precursor to be used together with the compound represented by the general formula (1), and a well-known and general precursor used in the CVD raw material may be used.

Examples of the above-mentioned other precursor include compounds consisting of one kind or two or more kinds selected from the group consisting of compounds used as organic ligands, such as an alcohol compound, a glycol compound, a β-diketone compound, a cyclopentadiene compound, and an organic amine compound, and silicon or a metal. Examples of the kind of the metal in the other precursor include lithium, sodium, potassium, magnesium, calcium, strontium, barium, titanium, zirconium, hafnium, vanadium, tantalum, chromium, molybdenum, tungsten, manganese, iron, cobalt, rhodium, iridium, nickel, palladium, platinum, copper, silver, gold, zinc, aluminum, germanium, tin, lead, antimony, bismuth, yttrium, lanthanum, cerium, praseodymium, neodymium, promethium, samarium, europium, gadolinium, terbium, dysprosium, holmium, erbium, thulium, ytterbium, ruthenium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy) ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-s-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the β-diketone compound to be used as the organic ligand in the above-mentioned other precursor include: alkyl-substituted β-diketones, such as acetylacetone, hexane-2,4-dione, 5-methylhexane-2,4-dione, heptane-2,4-dione, 2-methylheptane-3,5-dione, 5-methylheptane-2,4-dione, 6-methylheptane-2,4-dione, 2,2-dimethylheptane-3,5-dione, 2,6-dimethylheptane-3,5-dione, 2,2,6-trimethylheptane-3,5-dione, 2,2,6,6-tetramethylheptane-3,5-dione, octane-2,4-dione, 2,2,6-trimethyloctane-3,5-dione, 2,6-dimethyloctane-3,5-dione, 2,9-dimethylnonane-4,6-dione, 2-methyl-6-ethyldecane-3,5-dione, and 2,2-dimethyl-6-ethyldecane-3,5-dione; fluorine-substituted alkyl β-diketones, such as 1,1,1-trifluoropentane-2,4-dione, 1,1,1-trifluoro-5,5-dimethylhexane-2,4-dione, 1,1,1,5,5,5-hexafluoropentane-2,4-dione, and 1,3-diperfluorohexylpropane-1,3-dione; and ether-substituted β-diketones, such as 1,1,5,5-tetramethyl-1-methoxyhexane-2,4-dione, 2,2,6,6-tetramethyl-1-methoxyheptane-3,5-dione, and 2,2,6,6-tetramethyl-1-(2-methoxyethoxy) heptane-3,5-dione.

Examples of the cyclopentadiene compound to be used as the organic ligand in the above-mentioned other precursor include cyclopentadiene, methylcyclopentadiene, ethylcyclopentadiene, propylcyclopentadiene, isopropylcyclopentadiene, butylcyclopentadiene, sec-butylcyclopentadiene, isobutylcyclopentadiene, tert-butylcyclopentadiene, dimethylcyclopentadiene, and tetramethylcyclopentadiene.

Examples of the organic amine compound to be used as the organic ligand in the above-mentioned other precursor include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. An example of the production methods is given below. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal, and examples of the alkali metal alkoxide may include a sodium alkoxide, a lithium alkoxide, and a potassium alkoxide.

In the case of the single source method, a compound similar to the compound represented by the general formula (1) in the behavior of thermal decomposition and/or oxidative decomposition is preferably used as the above-mentioned other precursor. In the case of the cocktail source method, a compound that not only is similar to the compound represented by the general formula (1) in the behavior of thermal decomposition and/or oxidative decomposition but also does not cause any change impairing desired characteristics as a precursor through a chemical reaction or the like at the time of mixing is preferably used as the above-mentioned other precursor because a high-quality thin-film can be produced with high productivity.

In addition, the thin-film forming raw material of the present invention may contain a nucleophilic reagent as required in order to impart the stability of each of the compound represented by the general formula (1) and the other precursor. Examples of the nucleophilic reagent include: ethylene glycol ethers, such as glyme, diglyme, triglyme, and tetraglyme; crown ethers, such as 18-crown-6, dicyclohexyl-18-crown-6,24-crown-8, dicyclohexyl-24-crown-8, and dibenzo-24-crown-8; polyamines, such as ethylenediamine, N, N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. The usage amount of each of those nucleophilic reagents is preferably from 0.1 mol to 10 mol, more preferably from 1 mol to 4 mol with respect to 1 mol of the amount of the entire precursors because a high-quality thin-film can be produced with high productivity.

The thin-film forming raw material of the present invention is prevented from containing impurity metal elements except the components for forming the raw material, impurity halogens such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less because a high-quality thin-film can be produced with high productivity. In particular, when the raw material is used as the gate insulating film, gate film, or barrier layer of an LSI, the contents of an alkali metal element and an alkaline-earth metal element that influence the electrical characteristics of a thin-film to be obtained need to be reduced. The content of the impurity halogens is preferably 100 ppm or less, more preferably 10 ppm or less, most preferably 1 ppm or less because a high-quality thin-film can be produced with high productivity. The total content of the impurity organic substances is preferably 500 ppm or less, more preferably 50 ppm or less, most preferably 10 ppm or less because a high-quality thin-film can be produced with high productivity. In addition, moisture causes generation of particles in the chemical vapor deposition raw material and generation of particles during thin-film formation. Accordingly, moisture in each of the precursor, the organic solvent, and the nucleophilic reagent is preferably removed as much as possible before its use. The moisture content of each of the precursor, the organic solvent, and the nucleophilic reagent is preferably 10 ppm or less, more preferably 1 ppm or less.

In addition, it is preferred that the thin-film forming raw material of the present invention be prevented from containing particles to the extent possible in order to reduce or prevent particle contamination of a thin-film to be formed. Specifically, in particle measurement with a light scattering liquid particle detector in a liquid phase, it is preferred that the number of particles larger than 0.3 μm be 100 or less in 1 mL of the liquid phase, it is more preferred that the number of particles larger than 0.2 μm be 1,000 or less in 1 mL of the liquid phase, and it is most preferred that the number of particles larger than 0.2 μm be 100 or less in 1 mL of the liquid phase.

<Method of Producing Thin-Film>

Next, a method of producing a thin-film including using the thin-film forming raw material of the present invention is described. The method of producing a thin-film of the present invention is a method of producing a thin-film, the method including forming, on the surface of a substrate, a thin-film containing at least one kind of metal atom selected from the group consisting of: a hafnium atom; a zirconium atom; and a titanium atom through use of a raw material gas obtained by vaporizing the thin-film forming raw material of the present invention.

In addition, it is preferred that the production method of the present invention include: a raw material gas introduction step of introducing a raw material gas obtained by vaporizing the above-mentioned thin-film forming raw material into a film formation chamber having the substrate set therein; and a thin-film formation step of subjecting the compound represented by the general formula (1) in the raw material gas to decomposition and/or a chemical reaction, to thereby form, on the surface of the substrate, the thin-film containing at least one kind of metal atom selected from the group consisting of: a hafnium atom; a zirconium atom; and a titanium atom. Specifically, the method is preferably a CVD method including: introducing the raw material gas obtained by vaporizing the thin-film forming raw material of the present invention and a reactive gas to be used as required into the film formation chamber (treatment atmosphere) having the substrate set therein; and then subjecting a precursor in the raw material gas to decomposition and/or a chemical reaction on the substrate, to thereby grow and deposit, on the surface of the substrate, the thin-film containing at least one kind of metal atom selected from the group consisting of: a hafnium atom; a zirconium atom; and a titanium atom. A transport and supply method for the raw material, a deposition method therefor, a material for the substrate, production conditions, a production apparatus, and the like are not particularly limited, and well-known and general conditions and methods may be used.

Examples of the above-mentioned reactive gas to be used as required include: oxidizing gases, such as oxygen, ozone, and water vapor; reducing gases, such as a hydrocarbon compound, for example, methane or ethane, hydrogen, carbon monoxide, and an organic metal compound; and nitriding gases, such as an organic amine compound, for example, a monoalkylamine, a dialkylamine, a trialkylamine, or an alkylenediamine, hydrazine, and ammonia. Those reactive gases may be used alone or as a mixture thereof. The compound represented by the general formula (1) has such a property as to satisfactorily react with the oxidizing gas, and has such a property as to particularly satisfactorily react with an ozone gas or water vapor. Accordingly, the oxidizing gas is preferably used as the reactive gas, and the ozone gas or water vapor is particularly preferably used.

In addition, examples of the above-mentioned transport and supply method for the raw material include the gas transport method, the liquid transport method, the single source method, and the cocktail source method described above.

In addition, examples of the above-mentioned deposition method include: a thermal CVD method including causing a raw material gas or the raw material gas and a reactive gas to react only with heat, to thereby deposit a thin-film; a plasma CVD method using heat and plasma; an optical CVD method using heat and light; an optical plasma CVD method using heat, light, and plasma; and an ALD method including dividing a deposition reaction of a CVD method into elementary steps, and performing deposition at a molecular level in a stepwise manner.

Examples of a material for the above-mentioned substrate include: silicon; ceramics, such as silicon nitride, titanium nitride, tantalum nitride, titanium oxide, ruthenium oxide, zirconium oxide, hafnium oxide, and lanthanum oxide; glass; and metals such as metal cobalt. Examples of the shape of the substrate include a plate shape, a spherical shape, a fibrous shape, and a scaly shape. The surface of the substrate may be planar, or may have a three-dimensional structure such as a trench structure.

In addition, examples of the above-mentioned production conditions include a reaction temperature (substrate temperature), a reaction pressure, and a deposition rate. The reaction temperature is preferably from room temperature to 500° C., more preferably from 200° C. to 500° C. because a high-quality thin-film can be produced with high productivity. In addition, the reaction pressure is preferably from 10 Pa to an atmospheric pressure in the case of the thermal CVD method or the optical CVD method, and is preferably from 10 Pa to 2,000 Pa in the case of using plasma because a high-quality thin-film can be produced with high productivity.

In addition, the deposition rate may be controlled by the supply conditions (vaporization temperature and vaporization pressure) of the raw material, the reaction temperature, and the reaction pressure. When the deposition rate is high, the characteristics of a thin-film to be obtained may deteriorate. When the deposition rate is low, a problem may occur in productivity. Accordingly, the deposition rate is preferably from 0.01 nm/min to 100 nm/min, more preferably from 0.1 nm/min to 50 nm/min. In addition, in the case of the ALD method, the deposition rate is controlled by the number of cycles so that a desired film thickness may be obtained.

Further, examples of the above-mentioned production conditions include a temperature and a pressure at the time of the vaporization of the thin-film forming raw material to provide the raw material gas. The step of vaporizing the thin-film forming raw material to provide the raw material gas may be performed in the raw material container or in the vaporization chamber. In any case, it is preferred that the thin-film forming raw material of the present invention be vaporized at from 0° C. to 150° C. In addition, when the thin-film forming raw material is vaporized in the raw material container or in the vaporization chamber to provide the raw material gas, the pressure in the raw material container and the pressure in the vaporization chamber are each preferably from 1 Pa to 10,000 Pa because a high-quality thin-film can be produced with high productivity.

The method of producing a thin-film of the present invention is preferably the ALD method out of the CVD methods. In the case of the ALD method, for example, it is preferred that: the production method include, between the above-mentioned raw material gas introduction step and thin-film formation step, a precursor thin-film formation step of depositing, on the surface of the substrate, the compound represented by the general formula (1) in the raw material gas, to thereby form a precursor thin-film; and the thin-film formation step be a step of causing the precursor thin-film to chemically react with a reactive gas, to thereby form, on the surface of the substrate, the thin-film containing at least one kind of metal atom selected from the group consisting of: a hafnium atom; a zirconium atom; and a titanium atom. Further, the method is more preferably a method of producing a thin-film including an exhaust step of evacuating the raw material gas containing an unreacted compound. In the present invention, the term "deposition" represents a concept including the chemical adsorption of the compound to the surface of the substrate.

The respective steps of the above-mentioned ALD method are described in detail below by taking a case in which a hafnium oxide film is formed as a thin-film containing a hafnium atom as an example. First, the above-mentioned raw material gas introduction step is performed. A preferred temperature and a preferred pressure when the thin-film forming raw material is turned into the raw material gas are the same as those described in the method of producing a thin-film by the CVD method. Next, when the raw material gas introduced into the film formation chamber and the surface of the substrate are brought into contact with each other, the compound represented by the general formula (1) in the raw material gas is deposited on the surface of the substrate to form the precursor thin-film (precursor thin-film formation step).

In the above-mentioned precursor thin-film formation step, heat may be applied by heating the substrate or by heating the film formation chamber. The temperature of the substrate in this case is preferably from room temperature to 500° C., more preferably from 200° C. to 500° C. The pressure of a system (the inside of the film formation chamber) when this step is performed is preferably from 1 Pa to 10,000 Pa, more preferably from 10 Pa to 1,000 Pa. When the thin-film forming raw material includes the other precursor except the compound of the present invention, the other precursor also deposits on the surface of the substrate together with the compound of the present invention.

Next, the vapor of the thin-film forming raw material that has not deposited on the surface of the substrate is exhausted from the film formation chamber (exhaust step). Although the vapor of the thin-film forming raw material that has not deposited on the surface of the substrate and a by-product gas should ideally be completely exhausted from the film formation chamber, they are not necessarily completely exhausted. Examples of an exhaust method include a method in which the inside of the system is purged with an inert gas such as nitrogen, helium, or argon, a method of exhausting by reducing the pressure in the system, and a combination method thereof. When the pressure is reduced, the degree of pressure reduction is preferably from 0.01 Pa to 300 Pa, more preferably from 0.01 Pa to 100 Pa because a high-quality thin-film can be produced with high productivity.

Next, an oxidizing gas is introduced as the reactive gas into the film formation chamber, and the hafnium oxide film is formed from the precursor thin-film obtained in the previous precursor thin-film formation step through the action of the oxidizing gas or the action of the oxidizing gas and heat (thin-film formation step). A temperature when the heat is applied in this step is preferably from room temperature to 500° C., more preferably from 200° C. to 500° C. because a high-quality thin-film can be produced with high productivity. In addition, the pressure of the system (inside of the film formation chamber) when this step is performed is preferably from 1 Pa to 10,000 Pa, more preferably from 10 Pa to 1,000 Pa because a high-quality thin-film can be produced with high productivity. The compound represented by the general formula (1) has satisfactory reactivity with the oxidizing gas, and hence a high-quality hafnium oxide film having a low residual carbon content can be obtained.

In the case where the ALD method is adopted in the method of producing a thin-film of the present invention as described above, the following may be performed: thin-film deposition by a series of operations consisting of the raw material gas introduction step, the precursor thin-film formation step, the exhaust step, and the thin-film formation step described above is defined as one cycle; and the cycle is repeated a plurality of times until a thin-film having a required thickness is obtained. In this case, the following is preferably performed: after the performance of one cycle, the compound gas and the reactive gas that are unreacted, and the by-product gas are exhausted from the film formation chamber in the same manner as in the above-mentioned exhaust step, and then the next one cycle is performed.

In addition, in the formation of the hafnium oxide film by the ALD method, energy, such as plasma, light, or a voltage, may be applied, and a catalyst may be used. There are no particular limitations on the timing of the application of the energy and the timing of the use of the catalyst. The energy may be applied or the catalyst may be used, for example, at the time of the introduction of the compound gas in the raw material gas introduction step, at the time of heating in the precursor thin-film formation step or the hafnium-containing thin-film formation step, at the time of the exhaust of the inside of the system in the exhaust step, or at the time of the introduction of the oxidizing gas in the hafnium-containing thin-film formation step, or between the above-mentioned respective steps.

In addition, in the method of producing a thin-film of the present invention, after the thin-film deposition, annealing treatment may be performed under an inert atmosphere, an oxidizing atmosphere, or a reducing atmosphere for obtaining more satisfactory electrical characteristics. In the case where step coverage is required, a reflow step may be provided. The temperature in the chamber in this case is preferably from 200° C. to 1,000° C., more preferably from 250° C. to 500° C.

A well-known ALD apparatus may be used in the method of producing a thin-film of the present invention. Specific examples of the ALD apparatus include such an apparatus capable of performing bubbling supply of a precursor as illustrated in each of FIG. 1 and FIG. 3, and such an apparatus including a vaporization chamber as illustrated in each of FIG. 2 and FIG. 4. Such an apparatus capable of subjecting the reactive gas to plasma treatment as illustrated in each of FIG. 3 and FIG. 4 is also permitted. The apparatus is not limited to such single-substrate type apparatus each including a film formation chamber as illustrated in FIG. 1 to FIG. 4, and an apparatus capable of simultaneously processing a large number of substrates through use of a batch furnace may be used. Those apparatus may also be used as CVD apparatus.

A thin-film produced by using the thin-film forming raw material of the present invention may be formed as desired kinds of thin-films, such as thin-films of a metal, oxide ceramics, nitride ceramics, and glass, by appropriately selecting the other precursor, the reactive gas, and the production conditions. It has been known that the thin-film exhibits electrical characteristics, optical characteristics, and the like. Thus, the thin-film has been applied to various usage modes. Examples thereof include a metal thin-film, a metal oxide thin-film, a metal nitride thin-film, an alloy thin-film, and a metal-containing composite oxide thin-film. Those thin-films have been widely used in the production of, for example, an electrode material for a memory element typified by a DRAM element, a resistance film, a diamagnetic film used for the recording layer of a hard disk, and a catalyst material for a polymer electrolyte fuel cell.

EXAMPLES

The present invention is described in more detail below by way of Examples and Comparative Examples. However, the present invention is by no means limited by Examples and the like below.

Production of Compound of the Present Invention

Example 1

Production of Compound No. 1

7.94 Grams (22.4 mmol) of tetrakis(dimethylamino)hafnium and 71.0 mL of toluene were loaded into a 100-milliliter four-necked flask, and were stirred under room temperature. After that, the mixture was cooled under ice cooling under a stirred state, and 3.32 g (24.2 mmol) of 5-(2-(dimethylamino)ethyl)-1,3-cyclopentadiene was dropped into the mixture. After that, the temperature of the mixture was returned to room temperature, and the mixture was stirred for 16 hours, followed by the removal of the solvent from the resultant solution. The produced hafnium complex was distilled at a bath temperature of 145° C., a pressure of 71 Pa, and a column top temperature of 126° C. to provide Compound No. 1 as a pale yellow and transparent liquid (yield: 3.09 g, percent yield: 30.9%).

(Analysis Values)

(1) Normal Pressure TG-DTA

50% mass loss temperature: 225° C. (760 Torr, Ar flow rate: 100 mL/min, temperature increase rate: 10° C./min, sample amount: 10.121 mg)

(2) Reduced Pressure TG-DTA

50% mass loss temperature: 137° C. (10 Torr, Ar flow rate: 50 mL/min, temperature increase rate: 10° C./min, sample amount: 9.581 mg)

(3) 1H-NMR (Deuterated Benzene)

2.13 ppm (6H, singlet), 2.42-2.46 ppm (2H, triplet), 2.72-2.76 ppm (2H, triplet), 2.98 ppm (18H, singlet), 5.95-5.97 ppm (4H, multiplet)

(4) Elemental Analysis (Metal Analysis: ICP-AES)

Hafnium content: 39.9 mass % (theoretical value: 39.9 mass %)

Example 2

Production of Compound No. 16

1.64 Grams (4.62 mmol) of tetrakis(dimethylamino)hafnium and 25.0 mL of toluene were loaded into a 100-milliliter four-necked flask, and were stirred under room temperature. After that, the mixture was cooled under ice cooling under a stirred state, and 0.62 g (4.99 mmol) of 5-(3-(methoxyethyl)-1,3-cyclopentadiene was dropped into the mixture. After that, the temperature of the mixture was returned to room temperature, and the mixture was stirred for 16 hours, followed by the removal of the solvent from the resultant solution. The resultant residue was purified in a kugelrohr at a bath temperature of 130° C. and a pressure of 140 Pa to provide Compound No. 16 as a pale yellow and transparent liquid (yield: 0.11 g, percent yield: 6.0%).

(Analysis Values)

(1) Normal Pressure TG-DTA

50% mass loss temperature: 219° C. (760 Torr, Ar flow rate: 100 mL/min, temperature increase rate: 10° C./min, sample amount: 10.444 mg)

(2) Reduced Pressure TG-DTA

50% mass loss temperature: 132° C. (10 Torr, Ar flow rate: 50 mL/min, temperature increase rate: 10° C./min, sample amount: 10.147 mg)

(3) $^1$H-NMR (Deuterated Benzene)

2.79-2.82 ppm (2H, triplet), 2.97 ppm (18H, singlet), 3.11 ppm (3H, singlet), 3.35-3.39 ppm (2H, triplet), 5.96 (4H, singlet)

(4) Elemental Analysis (Metal Analysis: ICP-AES)

Hafnium content: 41.2 mass % (theoretical value: 41.1 mass %)

Example 3

Production of Compound No. 22

1.54 Grams (4.34 mmol) of tetrakis(dimethylamino)hafnium and 25.0 mL of toluene were loaded into a 100-milliliter four-necked flask, and were stirred under room temperature. After that, the mixture was cooled under ice cooling under a stirred state, and 0.71 g (4.69 mmol) of 5-(3-(dimethylamino) propyl)-1,3-cyclopentadiene was dropped into the mixture. After that, the temperature of the mixture was returned to room temperature, and the mixture was stirred for 16 hours, followed by the removal of the solvent from the resultant solution. The resultant residue was purified in a kugelrohr at a bath temperature of 145° C. and a pressure of 56 Pa to provide Compound No. 22 as a pale yellow and transparent liquid (yield: 0.68 g, percent yield: 34.0%).

(Analysis Values)

(1) Normal Pressure TG-DTA

50% mass loss temperature: 235° C. (760 Torr, Ar flow rate: 100 mL/min, temperature increase rate: 10° C./min, sample amount: 10.172 mg)

(2) Reduced Pressure TG-DTA

50% mass loss temperature: 146° C. (10 Torr, Ar flow rate: 50 mL/min, temperature increase rate: 10° C./min, sample amount:

9.679 mg)

(3) $^1$H-NMR (Deuterated Benzene)

1.69-1.73 ppm (2H, multiplet), 2.10 ppm (6H, singlet), 2.17-2.20 ppm (2H, triplet), 2.59-2.63 ppm (2H, triplet), 3.00 ppm (18H, singlet), 5.92-5.94 ppm (2H, multiplet), 5.97-5.99 ppm (2H, multiplet)

(4) Elemental Analysis (Metal Analysis: ICP-AES)

Hafnium content: 38.6 mass (theoretical value: 38.7 mass %)

Example 4

Production of Compound No. 37

1.59 Grams (4.48 mmol) of tetrakis(dimethylamino)hafnium and 25.0 mL of toluene were loaded into a 100-milliliter four-necked flask, and were stirred under room temperature. After that, the mixture was cooled under ice cooling under a stirred state, and 0.67 g (4.83 mmol) of 5-(3-methoxypropyl)-1,3-cyclopentadiene was dropped into the mixture. After that, the temperature of the mixture was returned to room temperature, and the mixture was stirred for 16 hours, followed by the removal of the solvent from the resultant solution. The resultant residue was purified in a kugelrohr at a bath temperature of 150° C. and a pressure of 100 Pa to provide Compound No. 37 as a pale yellow and transparent liquid (yield: 0.94 g, percent yield: 47.0%).

(Analysis Values)

(1) Normal Pressure TG-DTA

50% mass loss temperature: 226° C. (760 Torr, Ar flow rate: 100 mL/min, temperature increase rate: 10° C./min, sample amount: 9.907 mg)

(2) Reduced Pressure TG-DTA

50% mass loss temperature: 141° C. (10 Torr, Ar flow rate: 50 mL/min, temperature increase rate: 10° C./min, sample amount: 10.116 mg)

(3) $^1$H-NMR (Deuterated Benzene)

1.79-1.84 ppm (2H, multiplet), 2.64-2.67 ppm (2H, triplet), 2.98 ppm (18H, singlet), 3.11 ppm (3H, singlet), 3.19-3.22 ppm (2H, triplet), 5.90-5.91 ppm (2H, multiplet), 5.96-5.98 ppm (2H, multiplet)

(4) Elemental Analysis (Metal Analysis: ICP-AES)

Hafnium content: 39.8 mass % (theoretical value: 39.9 mass %)

Example 5

Production of Compound No. 58

9.03 Grams (33.8 mmol) of tetrakis(dimethylamino)zirconium and 107 mL of toluene were loaded into a 200-milliliter four-necked flask, and were stirred under room temperature. After that, the mixture was cooled under ice cooling under a stirred state, and 4.53 g (36.5 mmol) of 5-(3-(methoxyethyl)-1,3-cyclopentadiene was dropped into the mixture. After that, the temperature of the mixture was returned to room temperature, and the mixture was stirred for 16 hours, followed by the removal of the solvent from the resultant solution. The produced zirconium complex was distilled at a bath temperature of 125° C., a pressure of 40 Pa, and a column top temperature of 115° C. to provide Compound No. 58 as a pale yellow and transparent liquid (yield: 7.00 g, percent yield: 59.8%).

(Analysis Values)

(1) Normal Pressure TG-DTA

50% mass loss temperature: 221° C. (760 Torr, Ar flow rate: 100 mL/min, temperature increase rate: 10° C./min, sample amount: 10.148 mg)

(2) Reduced Pressure TG-DTA

50% mass loss temperature: 135° C. (10 Torr, Ar flow rate: 50 mL/min, temperature increase rate: 10° C./min, sample amount: 8.889 mg)

(3) $^1$H-NMR (Deuterated Benzene)

2.75-2.80 ppm (2H, triplet), 2.92 ppm (18H, singlet), 3.12 ppm (3H, singlet), 3.36-3.39 ppm (2H, triplet), 5.96-5.99 ppm (4H, multiplet)

(4) Elemental Analysis (Metal Analysis: ICP-AES)

Zirconium content: 26.3 mass % (theoretical value: 26.3 mass %)

The compounds of the present invention obtained in Examples 1 to 5, and Comparative Compounds 1 and 2 described below were subjected to the following evaluations.

(1) State and Melting Point Evaluations

The state of each of the compounds at normal pressure and 25° C. was visually observed. When the compound was a solid at 25° C., its melting point was measured with a minute melting point-measuring device. It can be judged that a compound having a low melting point is excellent in transportability, and is hence preferred as a thin-film forming raw material. The results are shown in Table 1.

(2) Thermal Stability Evaluation

The thermal decomposition start temperature of each of the compounds was measured with a DSC measuring device. It can be judged that the thermal decomposition of a compound having a high thermal decomposition start temperature hardly occurs, and hence the compound is preferred as a thin-film forming raw material. The results are shown in Table 1.

Comparative Compound 1

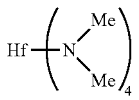

Comparative Compound 2

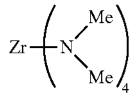

TABLE 1

| | Compound | State at 25° C. | Melting point [° C.] | Thermal decomposition start temperature [° C.] |
|---|---|---|---|---|
| Example 1 | Compound No. 1 | Liquid | — | 318 |
| Example 2 | Compound No. 16 | Liquid | — | 258 |
| Example 3 | Compound No. 22 | Liquid | — | 310 |
| Example 4 | Compound No. 37 | Liquid | — | 317 |
| Example 5 | Compound No. 58 | Liquid | — | 240 |
| Comparative Example 1 | Comparative Compound 1 | Solid | 32 | 285 |
| Comparative Example 2 | Comparative Compound 2 | Solid | 56 | 254 |

As shown in Table 1 above, it was found that while Comparative Compounds 1 and 2 were each a solid under the conditions of normal pressure and 25° C., each of the compounds of the present invention obtained in Examples 1 to 5 was a liquid and was a compound having a low melting point. In addition, while the thermal decomposition start temperature of each of Comparative Compounds 1 and 2 was 285° C. or less, the thermal decomposition start temperature of each of Compounds No. 1, No. 22, and No. 37 was 310° C. or more. Accordingly, it was found that Compounds No. 1, No. 22, and No. 37 were each a compound having high thermal stability.

Production of Thin-Film by ALD Method

Examples 6 to 10 and Comparative Examples 1 to 4

Production of Hafnium Oxide Film and Zirconium Oxide Film by ALD Method

A hafnium oxide thin-film or a zirconium oxide thin-film was produced from each of the compounds of the present invention obtained in Examples 1 to 5 and Comparative Compounds 1 to 4 serving as a thin-film forming raw material on the surface of a silicon substrate with an apparatus illustrated in FIG. 1 by an ALD method under the following conditions. The measurement of the thickness of the resultant thin-film by an X-ray reflectivity method, the identification of the compound thereof by an X-ray diffraction method, and the measurement of a carbon content and a chlorine content therein by X-ray photoelectron spectroscopy were performed. The results are shown in Table 2.

Comparative Compound 3

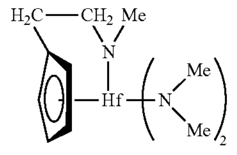

Comparative Compound 4

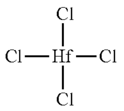

(Conditions)

Reaction temperature (substrate temperature): 300° C., reactive gas: ozone gas (Steps)

A series of steps consisting of the following steps (1) to (4) was defined as one cycle, and the cycle was repeated 50 times:

(1) the vapor (raw material gas) of the thin-film forming raw material vaporized under the conditions of a raw material container heating temperature of 90° C. and a raw material container internal pressure of 100 Pa is introduced into a system (film formation chamber), and the compound in the vapor is deposited on the surface of the silicon substrate at a system pressure of 100 Pa for 10 seconds (a raw material gas introduction step and a precursor thin-film formation step);

(2) the vapor containing an unreacted compound that has not deposited on the surface of the silicon substrate is exhausted from the inside of the system through argon purging for 10 seconds (an exhaust step);

(3) the reactive gas is introduced into the system, and the precursor thin-film and the reactive gas are caused to react with each other at a system pressure of 100 Pa for 20 seconds (a thin-film formation step); and (4) the unreacted reactive gas and a by-product gas are exhausted from the inside of the system through argon purging for 10 seconds (an exhaust step).

TABLE 2

| | Thin-film forming raw material | Thickness of thin-film | Kind of thin-film | Carbon content in thin-film | Chlorine content in thin-film |
|---|---|---|---|---|---|
| Example 6 | Compound No. 1 | 5.1 nm | Hafnium oxide | Undetectable*1 | Undetectable*1 |
| Example 7 | Compound No. 16 | 4.2 nm | Hafnium oxide | Undetectable*1 | Undetectable*1 |
| Example 8 | Compound No. 22 | 4.8 nm | Hafnium oxide | Undetectable*1 | Undetectable*1 |
| Example 9 | Compound No. 37 | 4.4 nm | Hafnium oxide | Undetectable*1 | Undetectable*1 |
| Example 10 | Compound No. 58 | 4.0 nm | Zirconium oxide | Undetectable*1 | Undetectable*1 |

TABLE 2-continued

| | Thin-film forming raw material | Thickness of thin-film | Kind of thin-film | Carbon content in thin-film | Chlorine content in thin-film |
|---|---|---|---|---|---|
| Comparative Example 1 | Comparative Compound 1 | 2.8 nm | Hafnium oxide | 3 atm % | Undetectable*1 |
| Comparative Example 2 | Comparative Compound 2 | 2.7 nm | Zirconium oxide | 3 atm % | Undetectable*1 |
| Comparative Example 3 | Comparative Compound 3 | 2.5 nm | Hafnium oxide | 4 atm % | Undetectable*1 |
| Comparative Example 4 | Comparative Compound 4 | 2.0 nm | Hafnium oxide | Undetectable*1 | 0.3 atm % |

*1The detection limit is 0.1 atm %.

As shown in Table 2, it was recognized that while the carbon content in the hafnium oxide film or the zirconium oxide film obtained by the ALD method was 3 atm % or more in each of Comparative Examples 1 to 3, and the chlorine content therein was 0.3 atm % in Comparative Example 4, the carbon content and the chlorine content were each less than 0.1 atm % that was the detection limit in each of Examples 6 to 10. In other words, it was shown that the use of the compound of the present invention provided a high-quality hafnium oxide film or zirconium oxide film in which a residual carbon content and a residual chlorine content derived from a thin-film forming raw material were each equal to or less than the detection limit. In addition, it was recognized that while the thickness of the resultant thin-film was 2.8 nm or less in each of Comparative Examples 1 to 4, the thickness was 4.0 nm or more in each of Examples 6 to 10, and hence the use of the compound of the present invention provided a hafnium oxide film or a zirconium oxide film with high productivity. The following was recognized: in each of Examples 6 and 8 out of those examples, the thickness of the resultant thin-film was 4.5 nm or more, and hence the hafnium oxide film was obtained with higher productivity; and particularly in Example 6, the thickness of the resultant thin-film was 5.0 nm or more, and hence the hafnium oxide film was obtained with particularly high productivity.

It was shown from the foregoing that the compound of the present invention was excellent as a thin-film forming raw material in, for example, an ALD method or a CVD method including a vaporization step because the compound was a compound having a low melting point and high thermal stability, and was able to produce a thin-film with high productivity when used as a thin-film forming raw material in the ALD method. It was shown that each of Compounds No. 1 and No. 22 out of such compounds was more excellent as the above-mentioned thin-film forming raw material because the compound was a compound that was in a liquid state at 25° C. and had high thermal stability, and the compound was able to form a thin-film with higher productivity when used as a thin-film forming raw material in the ALD method. In particular, it was shown that Compound No. 1 was particularly excellent as the above-mentioned thin-film forming raw material because the compound was able to provide a thin-film with particularly high productivity when used as a thin-film forming raw material in the ALD method.

The invention claimed is:

1. A thin-film forming raw material, comprising a compound represented by the following general formula (1):

(1)

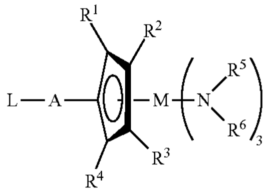

wherein $R^1$ to $R^4$ each independently represent a hydrogen atom or an alkyl group having 1 to 5 carbon atoms, $R^5$ and $R^6$ each independently represent an alkyl group having 1 to 5 carbon atoms, A represents an alkanediyl group having 1 to 5 carbon atoms, L represents a group represented by the following general formula (L-1) or (L-2):

(L-1)

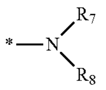

(L-2)

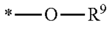

where $R^7$ to $R^9$ each independently represent an alkyl group having 1 to 5 carbon atoms, and

* represents a bonding site, and

M represents a hafnium atom, a zirconium atom, or a titanium atom;

provided that in a case of a compound represented by the general formula (1) in which:

$R^5$ and $R^6$ each represent a methyl group,

A represents an alkanediyl group having 2 carbon atoms, and

M represents a titanium atom,

L represents a group represented by the general formula (L-2); and provided that in a case of a compound represented by the general formula (1) in which:

$R^5$ and $R^6$ each represent a methyl group,

A represents an alkanediyl group having 2 carbon atoms, and

M represents a zirconium atom, $R^7$ represents a methyl group or an ethyl group.

2. A thin-film, which is formed from the thin-film forming raw material of claim 1.

3. A method of producing a thin-film comprising forming a thin-film from the thin-film forming material of claim 1 on the surface of a substrate.

4. The method of producing the thin-film according to claim 3, comprising:

introducing a raw material gas obtained by vaporizing the thin-film forming raw material into a film formation chamber having the substrate set therein; and subjecting the compound represented by the general formula (1) in the raw material gas to decomposition and/or a chemical reaction, to thereby form the thin-film containing at least one kind of metal atom selected from the group consisting of: a hafnium atom; a zirconium atom; and a titanium atom on a surface of the substrate.

5. The method of producing the thin-film according to claim 4, wherein the method further comprises, between the raw material gas introduction and the thin-film formation, depositing, on the surface of the substrate, the compound represented by the general formula (1) in the raw material gas, to thereby form a precursor thin-film; and wherein during the thin-film formation, causing the precursor thin-film to chemically react with a reactive gas, to thereby form, on the surface of the substrate, the thin-film.

* * * * *